(12) United States Patent
Hashimoto

(10) Patent No.: US 6,262,473 B1
(45) Date of Patent: Jul. 17, 2001

(54) FILM CARRIER TAPE AND SEMICONDUCTOR DEVICE, METHOD OF MAKING THE SAME AND CIRCUIT BOARD

(75) Inventor: Nobuaki Hashimoto, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/091,127

(22) PCT Filed: Oct. 8, 1997

(86) PCT No.: PCT/JP97/03599

§ 371 Date: Jun. 16, 1998

§ 102(e) Date: Jun. 16, 1998

(87) PCT Pub. No.: WO98/18162

PCT Pub. Date: Apr. 30, 1998

(30) Foreign Application Priority Data

Oct. 17, 1996 (JP) .................................................. 8-297531

(51) Int. Cl.[7] .................................................. H01L 23/495
(52) U.S. Cl. .......................... 257/668; 257/778; 438/108; 438/123
(58) Field of Search .................. 438/108, 123; 257/668, 778

(56) References Cited

U.S. PATENT DOCUMENTS

| 5,477,611 | 12/1995 | Sweis et al. . |
| 6,002,168 | * 12/1999 | Urushima ............................ 257/778 |
| 6,046,495 | * 12/1999 | Urushima ............................ 257/778 |

FOREIGN PATENT DOCUMENTS

| 54-14676 | 2/1979 | (JP) . |
| 62-86737 | 4/1987 | (JP) . |
| 4-260342 | 9/1992 | (JP) . |
| 5-235091 | 9/1993 | (JP) . |
| 7-226418 | 8/1995 | (JP) . |
| WO 95/08856 | 3/1995 | (WO) . |

* cited by examiner

*Primary Examiner*—Roy Potter
(74) *Attorney, Agent, or Firm*—Oliff & Berridge PLC.

(57) ABSTRACT

The invention relates to a semiconductor device formed by using a film carrier tape and having a package size that is close to the chip size, and also to a semiconductor device and a making method therefor which facilitates the injection of resin for sealing. A film carrier tape 32 comprises a plurality of connection leads (24); portions defining holes (29, 31) formed by punching out connection portions, where any one of the connection leads (24) are connected together, and by punching out an intersection portion; and portions defining rectangular holes (11, 15). Resin is injected through rectangular holes (11, 15), rectangular holes (12, 14) stop the spreading of the resin, and holes (29, 31) allow air to escape from the resin.

24 Claims, 6 Drawing Sheets

FILM CARRIER TAPE AND SEMICONDUCTOR DEVICE, METHOD OF MAKING THE SAME AND CIRCUIT BOARD

TECHNICAL FIELD

The invention relates to a semiconductor device and a method of making the same, a circuit board, and also a film carrier tape, and, in particular, to a film carrier tape and semiconductor device wherein the package size is close to the chip size, a method of making the same, and a circuit board.

BACKGROUND ART

If high-density mounting of semiconductor devices is to continue, bare-chip mounting would be ideal. However, quality assurance and handling are difficult in the bare chip state. A packaging method called CSP (chip scale/size package) has been developed to provide a package that has a size when packaged that is close to the chip size. This CSP type of semiconductor device has been developed in various forms; in one of them, a flexible substrate is provided on an active surface side of a semiconductor chip and a plurality of external electrodes are formed on that flexible substrate. With this semiconductor device, the external electrodes are provided within the area of the semiconductor chip, so that it does not have the "outer leads" that extend outward from the side surfaces of the package itself, as in a QFP (quad flat package) or TCP (tape carrier package), for example.

In a CSP type of semiconductor device that uses a flexible substrate, it is known to inject resin between the active surface of the semiconductor chip and the flexible substrate to absorb thermal stresses, as disclosed in, for example, International Publication WO95/08856.

However, various difficulties occur during the resin injection. For example, the resin is injected between the semiconductor chip and the flexible substrate, in other words, into a cramped region between the other components, and thus it is easy for air (air bubbles) to remain therein. If that should happen, the air (air bubbles) could expand at high temperatures and under high humidity, causing cracking. It is also difficult to stop the resin from flowing out from between the semiconductor chip and the flexible substrate.

The invention was devised in order to solve the above described 1 problems and its objective is to provide a film carrier tape and a semiconductor device, a method of making the same and a circuit board, wherein resin is readily injected in a favorable state between the semiconductor chip and the flexible substrate.

DISCLOSURE OF INVENTION (1) The method of making a semiconductor device in accordance with the invention comprises:
a step of disposing a flexible substrate having a plurality of connection leads and a plurality of holes above a semiconductor chip to form a gap; and
a step of injecting resin into the gap through at least one of the holes while removing air from at least one of the remainder of the holes.

With the invention, if resin is injected between the semiconductor chip and the flexible substrate to form a resin seal, air escapes from a hole making it difficult for air to remain in the resin. This makes it possible to obtain a semiconductor device that is more reliable at high temperatures and under high humidity.

(2) The above making method could be modified such that:
the holes comprise a central hole located at substantially the center of the semiconductor chip; and
the resin is injected through the central hole.

(3) The above making method could be modified such that:
the flexible substrate is larger than the semiconductor chip;
the holes comprise a bonding hole formed above electrodes of the semiconductor chip; and
the making method further comprises:
a step of connecting the connection leads and the electrodes through the bonding hole; and
a step of injecting the resin through the bonding hole onto an active surface comprising the connected electrodes of the semiconductor chip.

(4) The above making method could be modified such that:
there is a time difference between the injection of the resin through the central hole and the injection of the resin through the bonding hole.

(5) The above making method could be modified such that:
the holes comprise a resin-stopping hole formed above an end portion of the semiconductor chip; and
the resin-stopping hole stops the spreading of resin injected into the gap.

(6) The above making method could be modified such that:
the resin-stopping hole has a rectangular shape, one inner peripheral edge thereof is located outward of an outer peripheral edge of the semiconductor chip, and another edge opposite to the one inner peripheral edge is located inward of the outer peripheral edge of the semiconductor chip.

(7) The above making method could be modified such that:
the resin-stopping hole is formed above the electrodes of the semiconductor chip, and the connection leads and the electrodes are connected through the resin-stopping hole.

(8) The above making method could be modified such that:
part of the film carrier tape is used as the flexible substrate; and the making method comprises the step of separating the film carrier tape into an Individual piece, after the resin is injected.

(9) The above making method could comprise the step of forming the film carrier tape.

(10) With the above making method, the step of forming the film carrier tape could comprise:
a step of forming a conductive pattern on a film to connect together in a conductive state all of the connection leads connected by a plurality of connection portions formed within a region to be sealed in resin, a plating lead formed outside the resin-sealed region, and a representative lead provided extending from the plating lead and connected at an intersection portion to any one of the connection leads;
a step of electroplating the conductive pattern through the plating leads; and
a step of punching out the connection portions and the intersection portion.

(11) The above making method could be modified such that:
the connection portions and the intersection portion are punched out at the same time.

(12) The above making method could be modified such that:
the connection portions and the intersection portion are punched out one by one.

(13) The method of making a film carrier tape in accordance with the invention comprises:
a step of forming a conductive pattern on a film to connect together in a conductive state all of:
connection leads connected by a plurality of connection portions formed within a region to be sealed in resin, a plating lead formed outside the resin-sealed region, and a representative lead provided extending from the plating lead and connected at an intersection portion to any one the connection leads;
a step of electroplating the conductive pattern through the plating lead; and
a step of punching out the connection portions and the intersection portion.

With the invention, if resin is injected between the semiconductor chip and the film carrier tape to form a resin seal, air escapes from a hole making it difficult for air to remain in the resin. This makes it possible to fabricate a semiconductor device with an improved reliability at high temperatures and high humidity.

(14) The above making method could comprise a step of forming a central hole in the film located substantially at a center of the semiconductor chip.

(15) The above making method could comprise a step of forming a bonding hole in the film located above electrodes of the semiconductor chip.

(16) The above making method could comprise a step of forming a resin-stopping hole in the film located above an end portion of the semiconductor chip.

(17) The above making method could be modified such that:
the connection portions and the intersection portion are punched out at the same time.

(18) The above making method could be modified such that:
the connection portions and the intersection portion are punched out one by one.

The semiconductor device in accordance with the invention comprises:
a semiconductor chip having a plurality of electrodes;
a flexible substrate located above and aligned with said semiconductor chip with a predetermined distance therebetween, said flexible substrate having a plurality of holes;
pad portions formed on said flexible substrate and connected to said electrodes; and
resin located between said semiconductor chip and said flexible substrate for sealing a surface of said semiconductor chip having said electrodes.

(19) With the invention, the flexible substrate has holes formed therein so that water steam can escape from the holes in a reflow step, even if air is incorporated within the resin.

(20) The circuit board in accordance with the invention, the above semiconductor device is mounted thereon and connected electrically thereto through the pad portions.

(21) The invention, a film carrier tape used for a resin-sealed type semiconductor device, comprises:
pad portions on which external electrodes are formed, within a region to be sealed in resin;
a plurality of connection leads disposed within a region to be sealed in resin, for connecting each of the external electrodes to each of the electrodes of the semiconductor chip;
at least one plating lead formed outside the resin-sealed region; and
a representative lead formed from the plating lead towards the region to be sealed in resin; wherein:
a hole is formed by punching at a connection portion between one another of the connection leads and an intersection portion between the representative lead and any one of the connection leads.

(22) The above film carrier tape could comprise:
a central hole formed in a region corresponding to substantially a center of a semiconductor chip.

(23) The above film carrier tape could comprise:
a bonding hole formed in a region corresponding to above the electrodes of the semiconductor chip.

(24) The above film carrier tape could comprise:
a resin-stopping hole formed in a region corresponding to above an end portion of the semiconductor chip.

BEST MODE FOR CARRYING OUT THE INVENTION

A preferred embodiment of the invention is described below with reference to the accompanying drawings.

Figure 1:
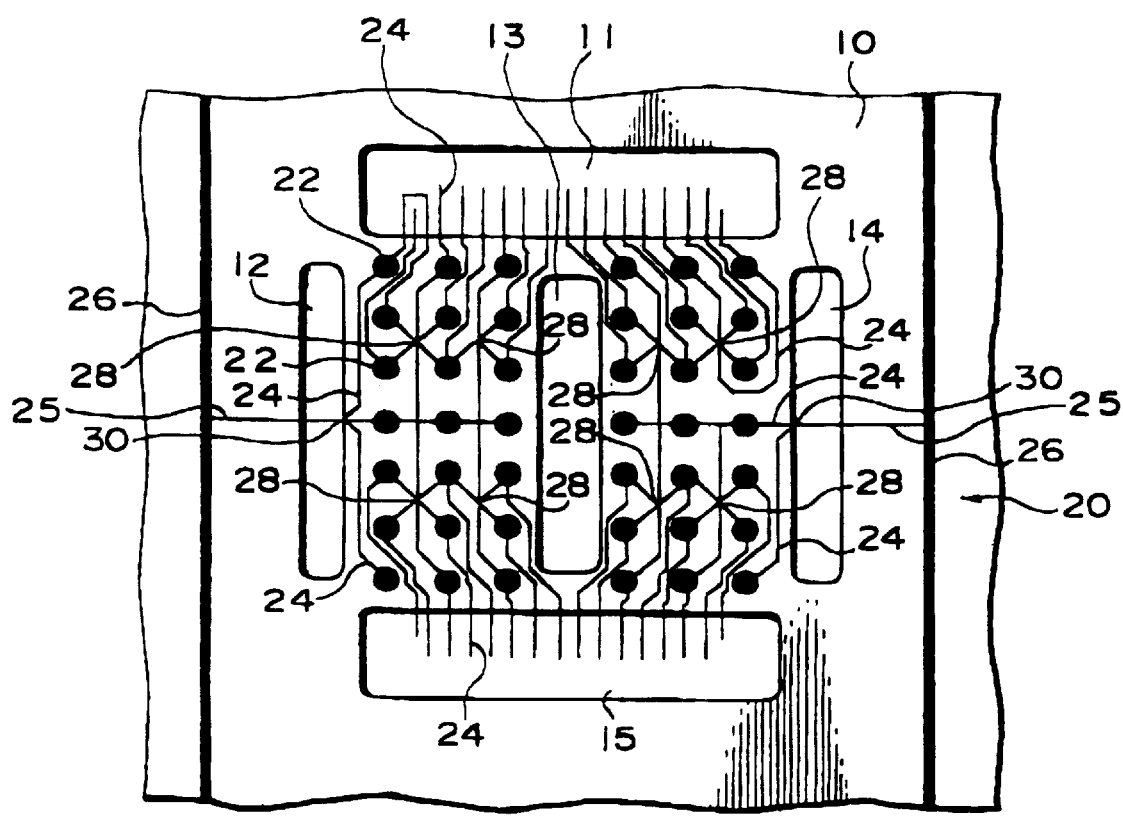
FIG. 1 is a view illustrating the method of making a semiconductor device in accordance with the embodiment.
Figure 2:
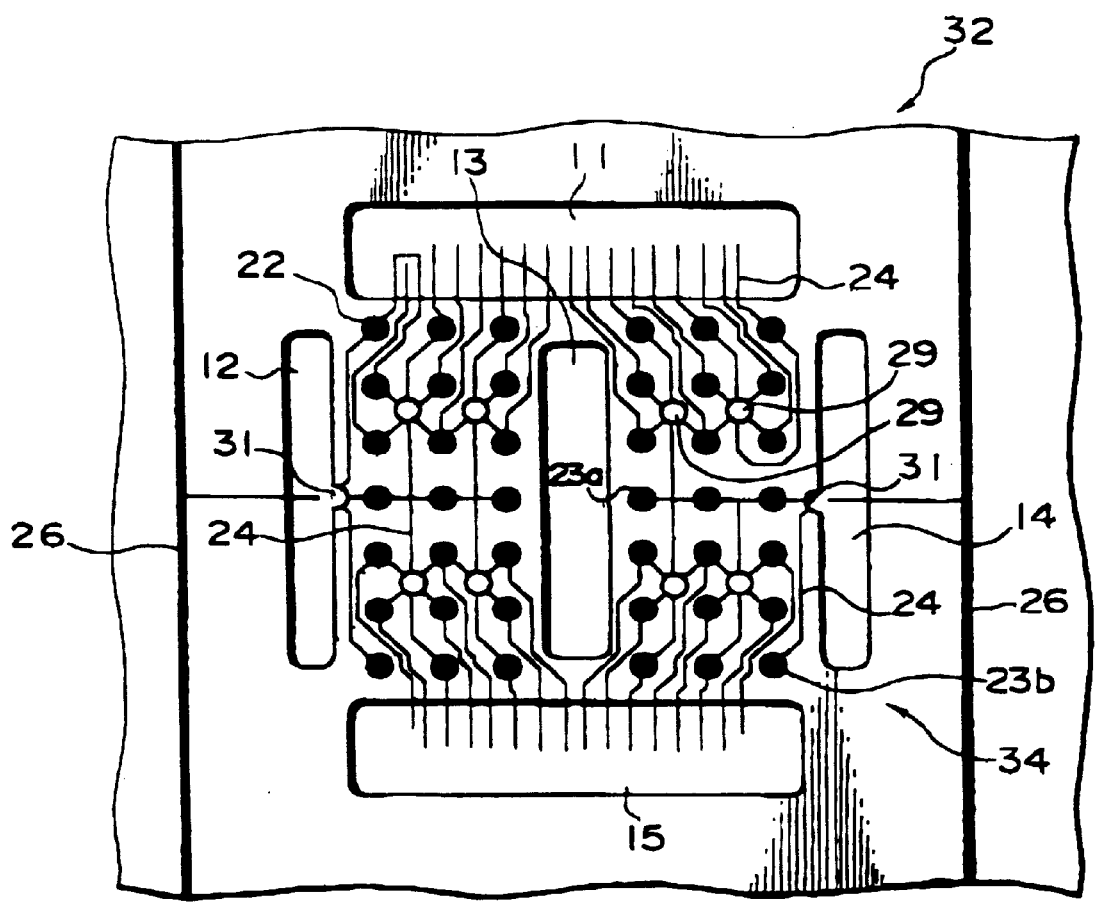
FIG. 2 is a view illustrating the method of making a semiconductor device in accordance with the embodiment.
Figure 3:
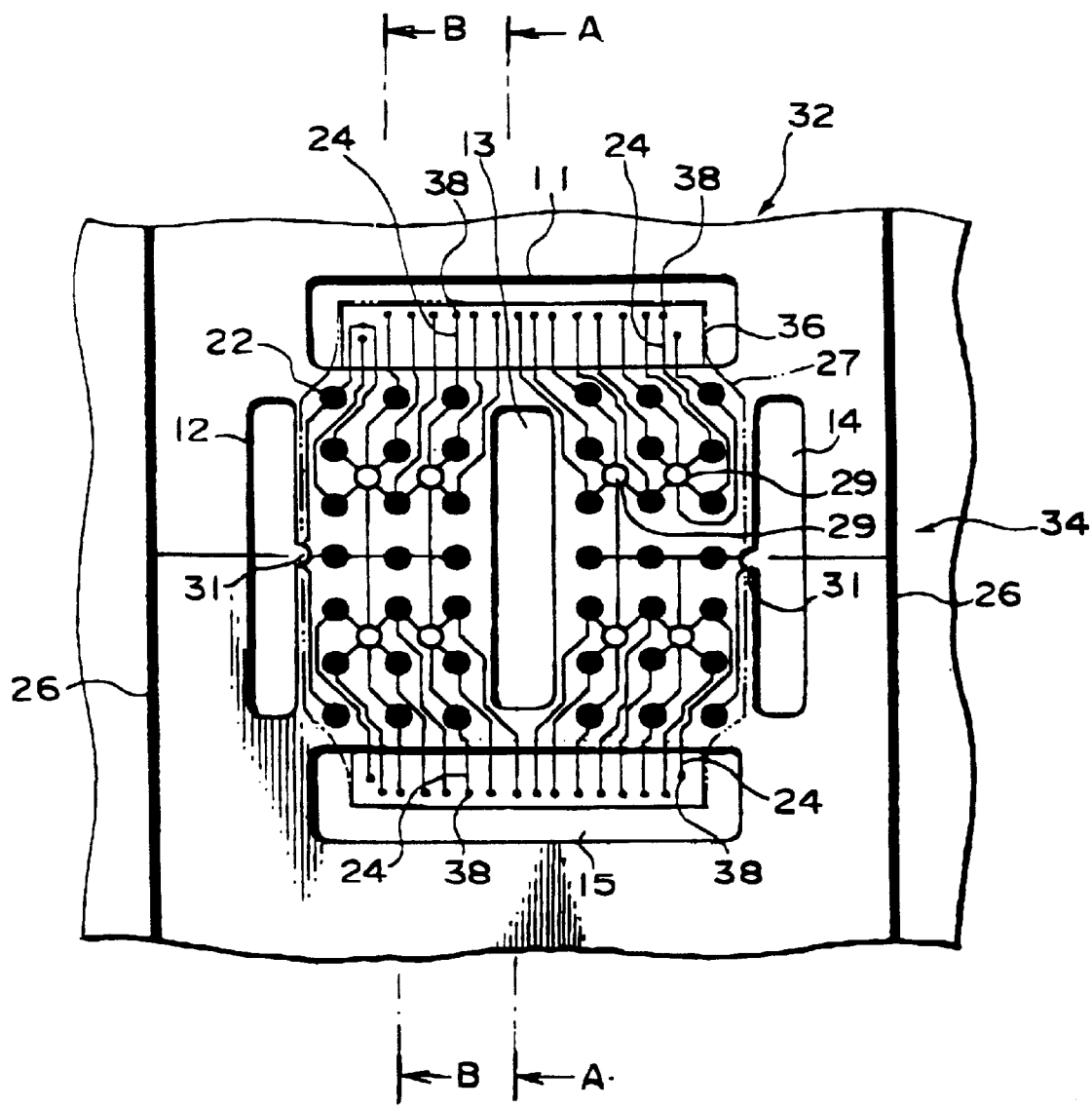
FIG. 3 is a view illustrating the method of making a semiconductor device in accordance with the embodiment.
Figure 4A:
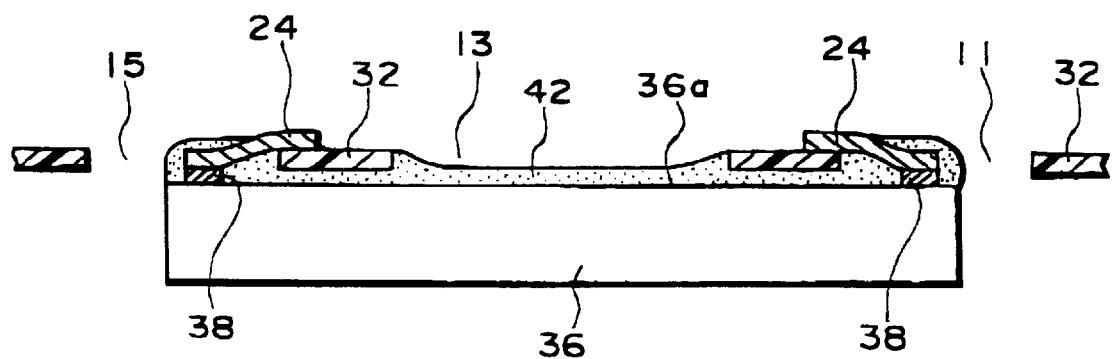
FIGS. 4A and 4B are views illustrating the method of making a semiconductor device in accordance with the embodiment.
Figure 4B:
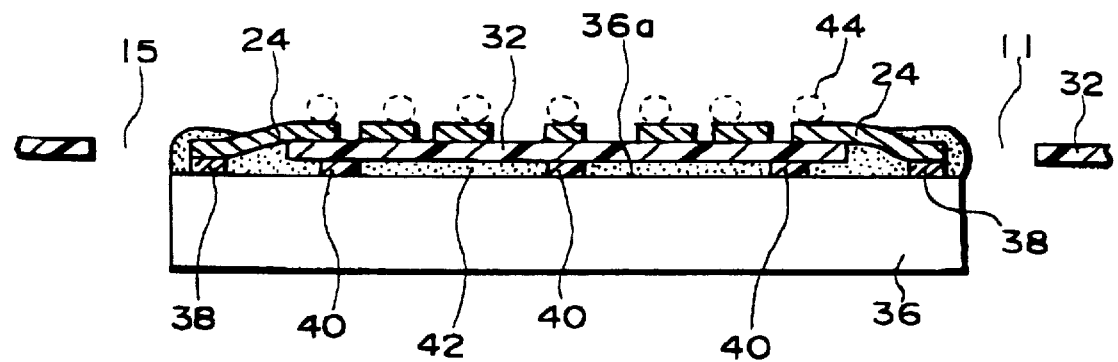

FIGS. 1 to 4B are views illustrating steps in the fabrication of a semiconductor device in accordance with the embodiment. More specifically, FIG. 1 shows a step in which a predetermined conductive pattern has been formed on a film, FIG. 2 shows a step of forming a desired circuit, in other words, a wiring pattern, by punching out part of the conductive pattern, and FIG. 3 shows a step of performing resin sealing with the film disposed over the semiconductor is chip. Finally, FIGS. 4A and 4B show states after resin sealing. Note that FIGS. 1 to 3 show only one circuit portion (a location that will ultimately be equivalent to one wiring pattern), but in fact the same circuit is formed repeatedly on a long, thin piece of film.

In FIG. 1, five rectangular holes 11 to 15 are formed in a piece of film 10, and a conductive pattern 20 is formed thereon. In this case, a tape material formed of a resin such as a polyimide, polyester, glass epoxy, or BT resin is used for the film 10. A material that has electrically insulating properties and is also flexible is used for the film 10. The conductive pattern 20 comprises pad portions 22, connection leads 24, and plating leads 26. Note that the pad portions 22, the connection leads 24, and the plating leads 26 of the conductive pattern 20 in this case are all made to be electrically conductive. Further details will be given later, but a wiring pattern 34 is defined to be distinct from the conductive pattern 20, and is a state in which a circuit has been formed, by predetermined treatment, from the conductive pattern 20 (a state which is intended to be completely conductive). The conductive pattern 20 is formed by a process such as the etching of a conductive foil formed of copper or the like. The pad portions 22 are places used for connections to external components such as a mounting circuit board, and means such as balls of solder are provided on these pad portions as connection members. The connection leads 24 are designed to connect the pad portions 22 electrically to electrodes 38 of a semiconductor chip 36 (see FIG. 3), and its end is a free end before the semiconductor chip 36 is connected. After the connection to the electrodes 38 of the semiconductor chip 36, the connection leads 24, which have their free ends, are fixed to the electrodes 38 of the semiconductor chip 36, and so of course can no longer be considered to have free ends. The connection leads 24 are connected to the plating leads 26. The plating leads 26 are designed to facilitate the electroplating of the conductive pattern 20, and one of these plating leads 25 is connected electrically to the other of the plating leads 26 by the connection leads 24 and the pad portions 22. In this example, a plurality of connection leads 24 are connected together electrically in a bundled state at one location, which is connected to one of the plating leads 26. More specifically, a plurality of connection leads 24 are bundled together and connected electrically, and only one representative lead 25 is finally connected to one of the plating leads 26. This means that the total number of plating leads 26 is less than the total number of connection leads 24 when they are each electrically independent. If the lead connected to this plating lead 26 is only a single representative lead 25 instead of a configuration in which each of the connection leads 24 is connected to the corresponding plating leads 26, as in this embodiment, a structure is formed in which the signal lines are not exposed at the outer ends of the semiconductor device (semiconductor package), making it possible to prevent the contamination that would otherwise occur at the outer ends of the semiconductor package, which tend to become dirty. This has various advantages, such as making it possible to prevent any deterioration in the moisture-proofing reliability of the semiconductor device and improving the reliability of the semiconductor package. When bundling the connection leads 24, it is necessary to consider the most effective bundling method. When the pad portions 22 are disposed in a matrix form, as in this example, it is preferable that connection portions 28 that form the points at which the connection leads 24 are bundled together (intersection points) are located in such a manner that they are as equidistant as possible from the pad portions 22. This is to make it possible to increase the distance between adjacent signal lines (the distance between each cut connection portion 28 and the neighboring pad portion 22) and thus improve the moisture-proofing reliability.

The connection leads 24 and the pad portions 22 are formed at locations within a resin-sealed region 27, as shown in FIG. 3, and the plating leads 26 are formed at locations outside the resin-sealed region 27 (more specifically, outside the region of the semiconductor device). Note that external electrodes are formed on the pad portions 22. For example, solder balls 44 as shown in FIG. 4B are used for these external electrodes. The connection leads 24 are formed to protrude into an aperture region on the inner side of each of the rectangular holes 11 and 15. The tips thereof are free ends within the aperture portion. Note that the connection leads 24 appear as free ends in this example, but it is not absolutely necessary for them to be free ends; they could extend along themselves beyond the rectangular holes 11 and 15, up to the film 10.

Gold plating is performed on the conductive pattern 20 with plating electrodes (not shown in the figure) that are connected to the plating leads 26. Note that various other kinds of plating than gold plating, such as by tin or solder, could be performed.

The conductive pattern 20 has connection portions (bundle points or intersection points) 28, at which a plurality of connection leads 24 are mutually connected, and an intersection portions 30 where connection leads 24 and one representative lead 25 extending from the plating lead 26 are connected. What is provided to bundle them into the single representative leads 25 is the intersection portions 30 and what connects them for the intersection portion 30 to bundle them is each connection portions 28. The connection portions 28 and the intersection portions 30 are located within the resin-sealed region shown in FIG. 3. After the plating has been performed, the connection portions 28 and the intersection portions 30 are punched out to obtain a film carrier tape 32 having a wiring pattern 34. A total number of holes 29 and 31 formed by punching out the connection portions 28 and the intersection portions 30 is less than the total number of connection leads 24. This is achieved by bundling together the connection leads 24. It is preferable that a plurality of connection leads 24 are formed at the same time by using the connection portions 28 and the intersection portions 30 as punch-out locations and by punching out the portions.

Either all of the pad portions 22 could be formed to be electrically functional, or special regions could be formed as dummy pad portions 23a and 23b, as shown in FIG. 2. In such a case, a pad portion 23a close to a central region is easily made to be a dummy because it is difficult to lead out its wire. On the other hand, if a pad portion 23b located at a corner is used actively as a dummy pad, the corners, which are most stress-prone, can be made free, enabling a configuration that aids stress relief.

The film carrier tape 32 is then disposed above the semiconductor chip 36 so as to overlay the semiconductor chip 36 with a predetermined gap therebetween, as shown in FIG. 3. To describe this embodiment in more detail, the film carrier tape 32 is arranged in such a manner that shorter edges of the semiconductor chip 36 are located within the rectangular holes 11 and 15 and longer edges thereof are concealed further inward than the inner sides of the rectangular holes 12 and 14. In this case, the rectangular holes 11 and 15 are used as holes for connecting the semiconductor chip 36 to the connection leads 24, so the electrodes 38 of the semiconductor chip 36 are located within these holes. Using these holes has the advantage of positioning the semiconductor chip 36 in a simple manner, even when the semiconductor chip 36 is covered by the film carrier tape 32.

To ensure a predetermined gap between an active surface 36a of the semiconductor chip 36 and the film carrier tape 32, a gap-maintaining material 40 could be placed between the active surface 36a of the semiconductor chip 36 and the film carrier tape 32, as shown in FIG. 4B.

A plurality of electrodes 38 of the semiconductor chip 36 could be bonded to a plurality of connection leads 24 in either a single batch or each electrode 38 individually.

Resin 42 is then injected into the gap between the semiconductor chip 36 and the film carrier tape 32, as shown in FIGS. 4A and 4B. More specifically, the resin 42 is injected through the rectangular holes 11 and 15 to form a seal around the electrodes 38. The resin 42 is also injected through the central rectangular hole 13 to form a resin layer between the semiconductor chip 36 and the film carrier tape 32. In the process of injecting resin, various embodiments can be adopted, regarding control of time for the injection from the periphery of the electrodes 38 and from the center (simultaneously or with a time lag). Simultaneous injection has the advantage of shortening the fabrication time by reducing the injection time. On the other hand, the injection into different portions with a time lag could be done periphery-first or center-first. Particularly, center-first injection has the advantage of making it possible to ensure that the process of injecting underfill, which is necessary for ensuring reliability during flip-chip mounting, for example, is performed accurately, by filling the peripheral portions after resin has been reliably filled between the semiconductor chip 36 and the film carrier tape 32 has been reliably filled.

This layer formed by the resin 42 is designed to absorb thermal stresses due to the difference in coefficients of thermal expansion between the semiconductor chip 36 and the film carrier tape 32 and, at the same time, protect the active surface 36a containing the electrodes 38 of the semiconductor chip 36.

In the embodiment, a plurality of holes 29 and 31 are formed in the region of the film carrier tape 32 filled by the resin 42 so that air can-escape therethrough. The resin layer formed by the resin 42, in other words, the gap between the active surface 36a of the semiconductor chip 36 and the film carrier tape 32, makes it difficult for air (air bubbles) to remain, achieving reliability even under conditions of high temperatures and high humidity. In addition to being used to allow air to escape, some of the plurality of holes 29 and 31 can also be used for injecting the resin 42, like the previously described rectangular hole. In addition, the holes 29 and 31, in a semiconductor device as finished goods, enable water steam to escape during a high-temperature reflow step for mounting it on an external board such as a printed board.

The connection leads 24 exposed within the rectangular holes 11 and 15 are also covered by the resin 42, providing insulation reliability. In particular, the resin 42 is injected in a state in which the portions connecting the electrodes 38 and the connection leads 24 are exposed within the holes, making it possible to visually verify the formation of the resin layer and thus improve reliability.

The rectangular holes 12 and 14 also function to prevent the resin 42 from spreading. In other words, the edges of the is longer sides of the semiconductor chip 36 are located inside of the rectangular holes 12 and 14, and the inner peripheral edges of the rectangular holes 12 and 14 are located thereabove. This ensures that the resin 42 is prevented from spreading by surface tension at the sides of the semiconductor chip 36 and the inner peripheral edges of the rectangular holes 12 and 14.

This makes it possible to perform the final punching-out at predetermined locations, after the resin sealing is finished, and thus complete the semiconductor device.

Variations on the above described embodiment can be conceived, as described below. In the above embodiment, the rectangular holes 11 and 15 on the sides where the electrodes 38 are located are designed to include the electrodes 38 of the semiconductor chip 36, in other words, they are provided in such a manner that they cross the electrodes 38, to facilitate the bonding of the semiconductor chip 36 and the connection leads 24. However, rectangular holes could be placed outside the electrodes 38 of the semiconductor chip 36 (the outer peripheral sides of the semiconductor chip 36), it they are formed only for preventing the resin from spreading. In such a case, it does not matter whether both edges of the rectangular holes would be located completely within the region of the semiconductor chip 36 (in other words, the two opposite sides of each rectangular hole would be completely located within the region of the semiconductor chip 36), or not (in other words, one of the two opposite edge of each rectangular hole is located within the region of the semiconductor chip 36, with the other edge being further outward than the outer periphery of the semiconductor chip 36). It should be noted, however, that it is preferable that one of the edges of each rectangular hole is located further outward than the region of the semiconductor chip 36, if the maximum resin-stopping effect is to be obtained. Note also that, since the rectangular holes are not designed for bonding, it is necessary to use a bonding method that facilitates bonding under such conditions, such as a method using an anisotropic conductive adhesive.

The outer peripheral edge of the semiconductor chip 36 was located further inward than the rectangular holes 12 and 14, at the longer edges of the semiconductor chip 36 (the sides which do not have the electrodes 38), but this configuration does not necessarily have to be used. In other words, the rectangular holes 12 and 14 could be provided within the region of the semiconductor chip 36. Since it is not necessary to consider bonding in this direction, there is a certain degree of freedom in this setting. Whatever the arrangement is, the resin has a shape of fillet through its viscosity and surface tension, as seen from the film carrier tape 32, thus achieving tight adhesion between the film carrier tape 32 and the resin 42.

Figure 5A:
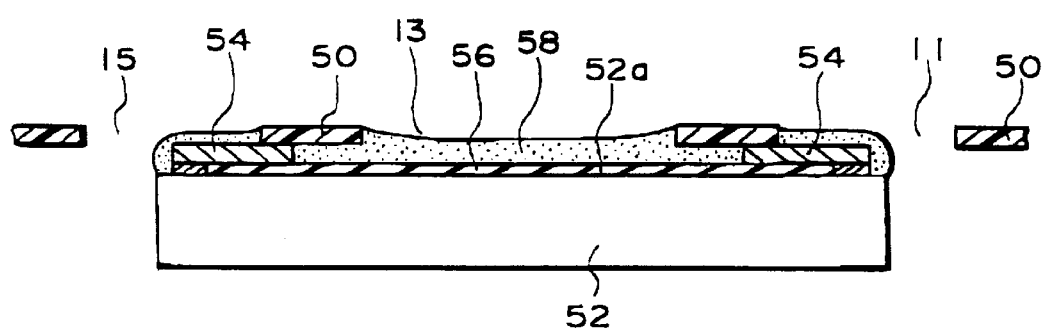
FIGS. 5A and 5B are views illustrating variations on the embodiment.
Figure 5B:
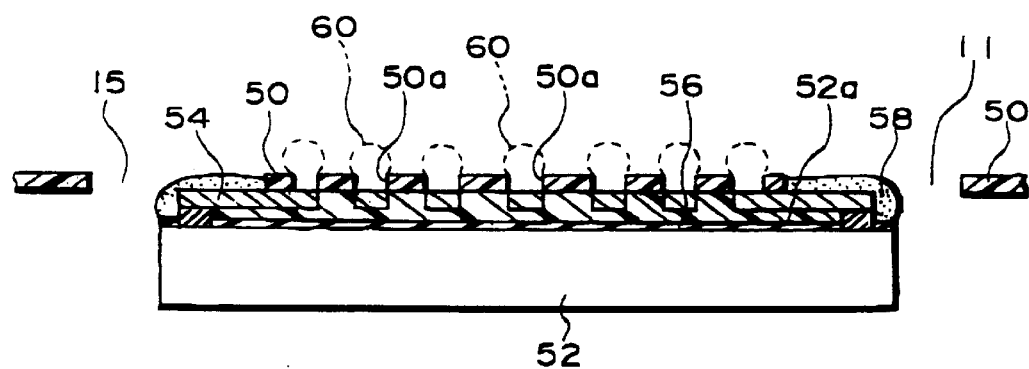

FIGS. 5A and 5B are views illustrating a variation on the above embodiment, which correspond to FIGS. 4A and 4B.

In FIGS. 5A and 5B, a film carrier tape 50 has connection leads 54 formed on its side facing an active surface 52a of a semiconductor chip 52. The connection leads 54 act as a gap-maintaining material, so that a gap is formed between the film carrier tape 50 and the active surface 52a. Note that the connection leads 54 are formed to have a thickness of approximately 15 to 35 $\mu$m. To ensure the insulation from the connection leads 54, a passivation film such as a silicon oxide film 56 is formed on the active surface 52a. Resin 58 is then injected between the film carrier tape 50 and the active surface 52a, to seal the semiconductor chip 52 in resin. A plurality of small holes 50a are also formed in the film carrier tape 50 over the connection leads 54, and solder balls 60 are provided through these small holes 50a.

Other details of the structure, such as those of the rectangular holes 11 to 15 and the holes 29 and 31, are similar to those of the above embodiment, so further description thereof is omitted.

This-variation can achieve similar effects to those of the above described embodiment. In addition, the use of the film carrier tape 50 of this embodiment ensures that the connection leads 54 are disposed below the film, that is to say, the film is located at the outermost side, so a step of coating the surfaces of the connection leads 54 with solder resist can be omitted.

In the above embodiments, chips having electrodes formed on two sides were used, but the case where electrodes are provided on four sides can also be applied. In such a case, rectangular holes would be provided in four directions on the tape.

In the example, a configuration in which the external electrodes extend into the semiconductor chip region, which is called a fan-in type, were explained, but the combination of a fan-in type and a fan-out type to the contrary can be applied. In such a case, the example can be used for the fan-in type and the prior art can be used for the fan-out type.

When plating is done in the above embodiments, well-known non-eloctrolytic plating methods could be used instead of electrolytic plating, despite somewhat the increase in production costs. In addition, the film carrier tape itself is not limited to a three-layer tape of conductive pattern, adhesive, and film, as described in the example; a two-layer tape wherein the adhesive of the above configuration has been removed could also be used.

Figure 6:
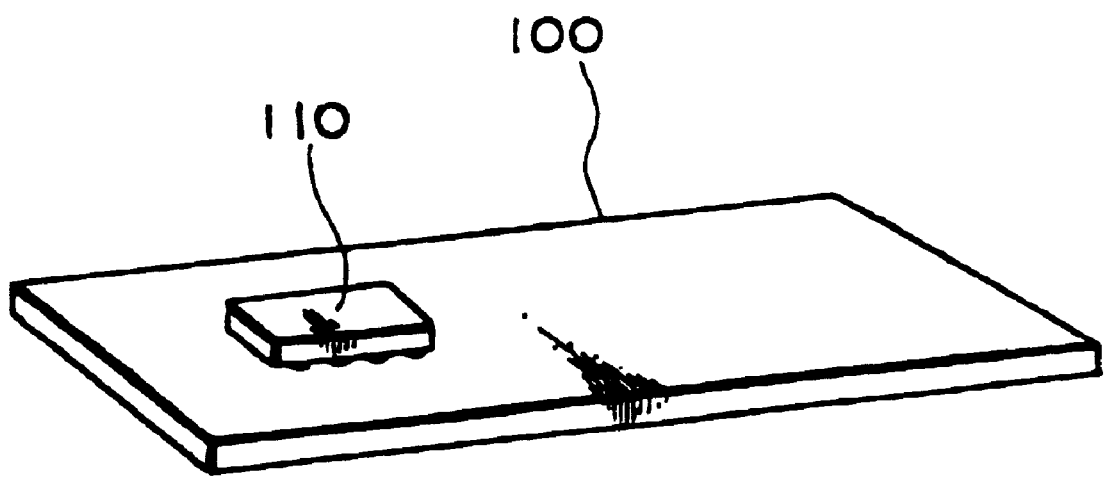
FIG. 6 is a view illustrating a circuit board on which a semiconductor device made in accordance with the invention is mounted.

FIG. 6 is a view illustrating a circuit board 100 on which a semiconductor device 110 fabricated by applying the above described embodiments is mounted.

What is claimed is:

1. A method of making a semiconductor device, comprising:
   a step of disposing a flexible substrate above a semiconductor chip to form a gap, said flexible substrate having a plurality of connection leads and portions defining a plurality of holes; and
   a step of injecting resin into said gap through at least one of said holes while removing air from at least one of the remainder of said holes.

2. The method of making a semiconductor device as defined in claim 1, wherein said holes comprise a central hole located substantially at a center of said semiconductor chip and said resin is injected through said central hole.

3. The method of making a semiconductor device as defined in claim 2, wherein:
   said flexible substrate is larger than said semiconductor chip;
   said holes comprise a bonding hole formed above electrodes of said semiconductor chip; and
   the method of making a semiconductor device further comprises:
   a step of connecting said connection loads and said electrodes through said bonding hole; and
   a step of injecting said resin through said bonding hole onto an active surface of said semiconductor chip, said active surface comprising said connected electrodes.

4. The method of making a semiconductor device as defined in claim 3, wherein there is a time difference between injection of said resin through said central hole and injection of said resin through said bonding hole.

5. The method of making a semiconductor device as defined in claim 2, wherein:
   said holes comprise a resin-stopping hole formed above an end portion of said semiconductor chip; and
   said resin-stopping hole stops the spread of resin injected into said gap.

6. The method of making a semiconductor device as defined in claim 5, wherein said resin-stopping hole has a rectangular shape with an inner peripheral edge located outward of an outer peripheral edge of said semiconductor chip and with another edge opposite to said inner peripheral edge, said other edge located inward of said outer peripheral edge of said semiconductor chip.

7. The method of making a semiconductor device as defined in claim 6, wherein said resin-stopping hole is formed above electrodes of said semiconductor chip, and said connection leads and said electrodes are connected through said resin-stopping hole.

8. The method of making a semiconductor device as defined in claim 1, wherein:
   part of a film carrier tape is used as said flexible substrate; and
   the method of making a semiconductor device further comprises a step of separating said film carrier tape into an individual piece, after said resin is injected.

9. The method of making a semiconductor device as defined in claim 8, further comprising a step of forming said film carrier tape.

10. The method of making a semiconductor device as defined in claim 9, wherein said step of forming said film carrier tape comprises:
    a step of forming a conductive pattern on a film to connect together all of said connection leads, a plating lead and a representative lead in a conductive state, said connection leads connected by a plurality of connection portions formed within a region to be sealed in resin, said plating lead formed outside said resin-sealed region, and said representative lead provided extending from said plating lead and connected at an intersection portion to any one of said connection leads;
    a step of electroplating said conductive pattern through said plating lead; and
    a step of punching out said connection portions and said intersection portion.

11. The method of making a semiconductor device as defined in claim 10, wherein said connection portions and said intersection portion are punched out at the same time.

12. The method of making a semiconductor device as defined in claim 10, wherein said connection portions and said intersection portion are punched out one by one.

13. A method of making a film carrier tape, comprising;
    a step of forming a conductive pattern on a film to connect together all of connection leads, a plating lead and representative lead in a conductive state, said connection leads connected by a plurality of connection portions formed within a region to be sealed in resin, said plating lead formed outside said resin-sealed region, and said representative lead provided extending from said plating lead and connected at an intersection portion to any one of said connection leads;
    a step of electroplating said conductive pattern through said plating lead; and
    a step of punching out said connection portions and said intersection portion.

14. The method of making a film carrier tape as defined in claim 13, further comprising a step of forming a central hole in said film located substantially at a canter of a semiconductor chip.

15. The method of making a film carrier tape as defined in claim 14, further comprising a step of forming a bonding hole in said film located above electrodes of said semiconductor chip.

16. The method of making a film carrier tape as defined in claim 15, further comprising a step of forming a resin-stopping hole in said film located above an end portion of said semiconductor chip.

17. The method of making a film carrier tape as defined in claim 13, wherein said connection portions and said intersection portion are punched out at the same time.

18. The method of making a film carrier tape as defined in claim 13, wherein said connection portions and said intersection portion are punched out one by one.

19. A semiconductor device, comprising:
    a semiconductor chip having a plurality of electrodes;
    a flexible substrate located above and aligned with said semiconductor chip with a predetermined distance therebetween, said flexible substrate having portions defining a plurality of holes;

pad portions formed on said flexible substrate and connected to said electrodes; and resin located between said semiconductor chip and said flexible substrate for sealing a surface of said semiconductor chip, said surface having said electrodes.

20. A circuit board with said semiconductor device as defined in claim 19 mounted thereon and electrically connected thereto through said pad portions of said semiconductor device.

21. A film carrier tape for a resin-sealed type semiconductor device, comprising:

pad portions on which external electrodes are formed within a region to be sealed in resin;

a plurality of connection leads disposed within said region to be sealed in said resin, each of said connection leads connecting each of said external electrodes to each of electrodes of a semiconductor chip;

at least one plating lead formed outside said resin-sealed region; and a representative lead formed from said plating lead towards said region to be sealed in said resin;

a connection portion connecting one another of said connection leads; and an intersection portion connecting said representative lead and any one of said connection leads, said connection portion and said intersection portion being punched into a hole.

22. The film carrier tape as defined in claim 21, further comprising a portion defining a central hole formed in a region corresponding to substantially a center of said semiconductor chip.

23. The film carrier tape as defined in claim 22, further comprising a portion defining a bonding hole formed in a region corresponding to above said electrodes of said semiconductor chip.

24. The film carrier tape as defined in claim 23, further comprising a portion defining a resin-stopping hole formed in a region corresponding to above an end portion of said semiconductor chip.

* * * * *